Figure 1:
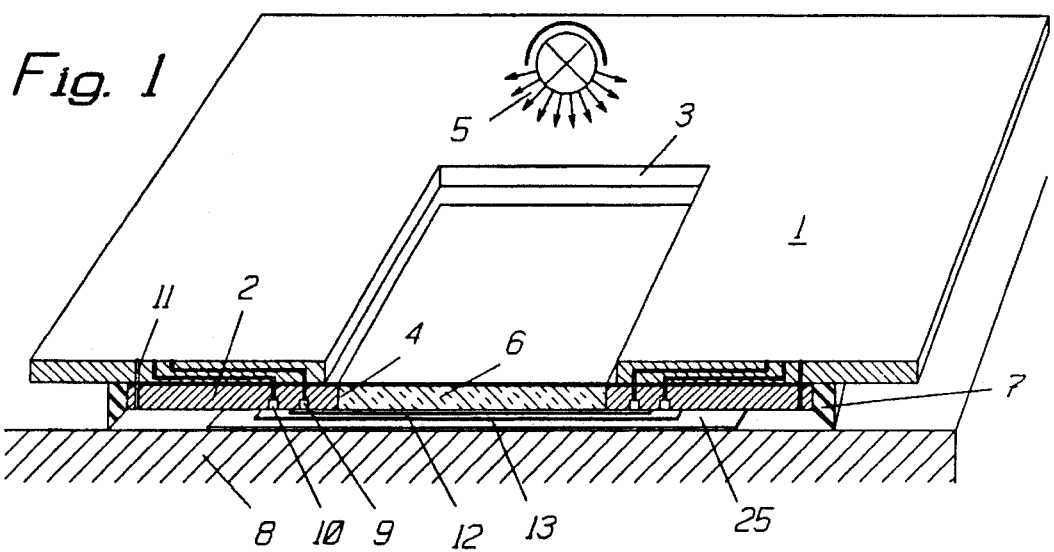

United States Patent [19]

Tilley

[11] Patent Number: 5,477,311

[45] Date of Patent: Dec. 19, 1995

[54] METHOD AND APPARATUS USED IN MAKING COPIES OF SEVERAL VARIOUS FILM SIZES

[75] Inventor: Richard M. Tilley, Chicago, Ill.

[73] Assignee: Misomex Aktiebolag, Stockholm, Sweden

[21] Appl. No.: 284,211

[22] Filed: Aug. 2, 1994

[30] Foreign Application Priority Data

Aug. 10, 1993 [SE] Sweden ............................ 9302595

[51] Int. Cl.⁶ .................................................. G03B 27/20
[52] U.S. Cl. .................................................. 355/91; 355/73
[58] Field of Search .................................... 355/73, 91, 94

[56] References Cited

U.S. PATENT DOCUMENTS

| | | | |
|---|---|---|---|
| 3,221,596 | 12/1965 | Hoffman | 355/73 |
| 3,551,048 | 12/1970 | Hoffman | 355/73 |
| 3,659,818 | 5/1972 | Duncan | 248/363 |
| 4,563,085 | 1/1986 | Ternes | 355/132 |
| 4,791,459 | 12/1988 | Hoffman | 355/91 |
| 4,908,658 | 3/1990 | Lundahl et al. | 355/76 |
| 4,967,230 | 10/1990 | Meacham | 355/91 |
| 4,984,017 | 1/1991 | Nishida et al. | 355/91 |
| 5,017,960 | 5/1991 | Tujlse | 355/91 |
| 5,057,865 | 10/1991 | Rosén | 355/91 |
| 5,206,680 | 4/1993 | Dillow | 355/91 |
| 5,300,973 | 4/1994 | Ternes et al. | 355/91 |

Primary Examiner—Richard A. Wintercorn
Attorney, Agent, or Firm—Larson and Taylor

[57] ABSTRACT

A method and a copying frame for copying of negative and positive original films, in combination with or without so called masking films, onto a material which is covered with a light sensitive layer, and having a frame rim of a non-transparent material and a glass plate inserted in a recess of said frame rim, and suction channels (9, 14, 17, 18) provided in said frame rim, and in which the copying frame, for making it possible to handle original films both of a "small" size format and of a "large" size format is formed with two sets of suction grooves, namely a) two cooperating, separate, parallel grooves (14) for suction connecting a "small" size original film (23), which grooves have a length matching the the width of said "small" size film format and are arranged along a part of the long sides of the frame rim, and b) two separate and cooperating, mainly C-shaped grooves (17) having the openings thereof facing each other and being arranged for suction connecting an original film of the "large" size film format, and which grooves (17, 18) extend over an entire short side and a slight distance (18) along each long side of the copying frame, but not as far as to the grooves (14) for the "small" size film format.

12 Claims, 3 Drawing Sheets

5,477,311

METHOD AND APPARATUS USED IN MAKING COPIES OF SEVERAL VARIOUS FILM SIZES

The present invention generally relates to a method for using a copy print frame of the type which is used for copying of negative and positive original films, in combination with, or without using so called masking films, onto a material which is covered with a light sensitive layer, like a printing plate, a light sensitive collection film or a similar material, and for which method the copying frame comprises a frame plate having a frame rim of a non-transparent material and, in a recess of said frame rim a glass plate against which one or more films is/are adapted to be sucked using suction channels provided in said frame rim, and which films are arranged for being copied down onto a light sensitive material like a printing plate, a light sensitive film or a similar material.

The frame rim of the copying frame is formed with all around extending suction grooves for suction connecting the film to the glass of the copying frame, and said suction grooves are connected to a source of sub pressure (vacuum). Often the copying is made in cooperation and in combination with a so called mask which screens off or covers certain parts of the original film against transmittance of light, and in this case there are two various systems of suction channels, namely an inner channel which is usually used for the masking film and an outer channel for the original film. The masking film and the original film are mounted in very exact positions on the copying frame by means of register pins.

So far copying frames of the above mentioned type usually have been designed for a predetermined film size, for instance the A3 size. The original films, however, are often of a smaller size, like A4, and in such case it has been necessary to tape or otherwise mount the original films of the "small" size format in a very accurately predetermined position on a transparent carrier foil of the "large" size format, for which the copying frame is adapated and formed. For this method it is necessary to perform a rather extensive and arduous work before the copying process is started and a certain dismounting work is involved after the copying process is ended, since the original film generally has to be saved in the "small" format. Also the carrier foil has to be saved for future jobs.

Alternatively it has be necessary to prepare the text and the pictures of the "small" size format on an original film of the "large" size format, which means a mounting thereof on an unnecessarily large film. This is not an economical and practical method. This method, of course, can not be actual when the very customer or the reproduction firm provides original films of the "small" size format adapted to copied onto the printing plate or a similar material.

In certain copying machines it is possible to substitute the copying frame for the "large" size format by another copying frame which is formed for handling of films having a "small" size format but this work, of course, involves a great deal of work and costs. Such a substitution of a copying frame is especially time consuming and troublesome in case it is desired to copy a seires of original films of alternating the "small" size and the "large" size format.

In some cases two films of the "small" size format have been mounted side by side on one and the same original film, sometimes on one and the same carrier foil so that they cover, in common, the suction grooves for the "large" size format. In such case it is possible to use a non-transparent masking film on one half of the copying glass and to copy only the remaining sole "small" film. Also this method involes some addition of work, and it also involves the disadvantage that the exposure can generally not be made with the exposure light placed centrally over the copying frame, and the exposure light preferably is—or even has to be—adjusted laterally so as to be position straight (cenrally) over the "small" size original film. Also in this case there appear problems when several films of varying formats have to be copied successively after each other.

The basis of the invention therefore has been to solve the problem of providing a copying frame of the above mentioned type, which is designed so that it is possible to alternatingly easily handle large size and small size original films;

so that it is not necessary to mount the small size film on a large carrier foil;

or so that there is no need for exchanging the copying frame when copying small and large original films, respectively, so that it is possible to save film material since it is no longer necessary to make use of un,necessarily large original films;

so that the copying frame according to the invention can be applied to available copying machines;

so that it is possible to make use of a special standard mask for the "small" size original film;

and so that both the "small" and the "large" size original film is always mounted centrally of the copying frame and centrally over the exposure light.

According to the invention the copying frame is formed with two sets of suction grooves, namely a) two cooperating, separate, parallel grooves for the "small" size film, each groove being located along a long side of the copying frame (=), preferably centrally of said side and extending over such a long distance as corresponding to the width of the "small" size film format, and which grooves are spaced by a distance which corresponds to the length is said small size film format;

b) and two separate and cooperating, mainly C-shaped grooves having the openings thereof facing each other ([]), which grooves provide the main suction channel for the "large" size original format, and each C-groove of which extends over an entire short side and a slight distance along each long side of the copying frame, but not as far as to the grooves for the "small" size film format.

Expressed in other words it can be said that the formerly existing sole suction channel for "large" size original films, like A3 format, has been split into two separate and cooperating A4-grooves and two separate and cooperating A3-grooves.

The two channel systems for "small" and "large" size original films respectively can be connected to one and the same suction system, but alternatively each channel system can have its own suction system, or each may have its own connection and disconnection mechanism, so that, in the latter case, the suction channels, in said last mentioned case, may be actuated with a suction force independently of each other. The suction system for the inner channel, which is intended to be used for the masking film, also may have a separate connection and disconnection means.

Surprisingly it has proved that a "small" size original film, an A4 film, is quite safely kept against the copying glass only by the two parallel A4-channels, by which only the two short sides of the original film is kept suction connected. For keeping a "large" size original film against the copying glass it is possible to use either on the two C-shaped suction grooves ([]) or both the A3-grooves and the A4-grooves ([] and =).

According a special aspect of the invention it is possible to make use of the A3-grooves for holding a standard masking film of the "large" size format by forming the long sides of such a masking film with slits which make the "small" size original film extend outside of said slits and be suction connected by the A4-grooves. Thereby the masking film is suction connected by means of the C-shaped A3-grooves. By this measurement it is possible provide the masking film inside (or outside of) the original film, as conventional, also is case of copying of small size original films.

Correspondingly it is possible to place a transparent, clear foil of the "large" size format (A3) having slits, as mentioned above, for the A4-grooves, over the original films of the "large" size format, and to interconnect the two sets of original channels. In this case the said foil, or the mask, acts both as a mask and as a blocking means for the original channel which is otherwise used for the "large" size original films. If this A3-channel is not blocked the original channels for a "small" size or for a "large" size film have to be maneuvred separately for making it possible to pick up a small size film. In other words it is possible, in said last mentioned case, to connect the vacuum channels for large and small size original films to one and the same source of sub pressure (vaccuum), and this, in turn, makes it possible to utilize the method in existing, available copying machines having one sole source of suction for the original films.

Further advantages and characteristics of the invention will be evident from the following detailed description, in which reference will be made to the accompanying drawings.

Figure 2:
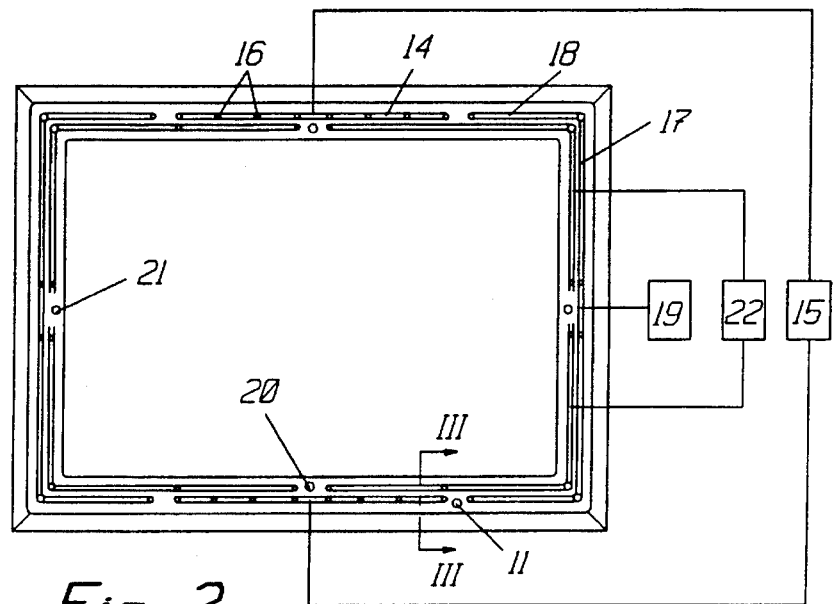
Figure 3:
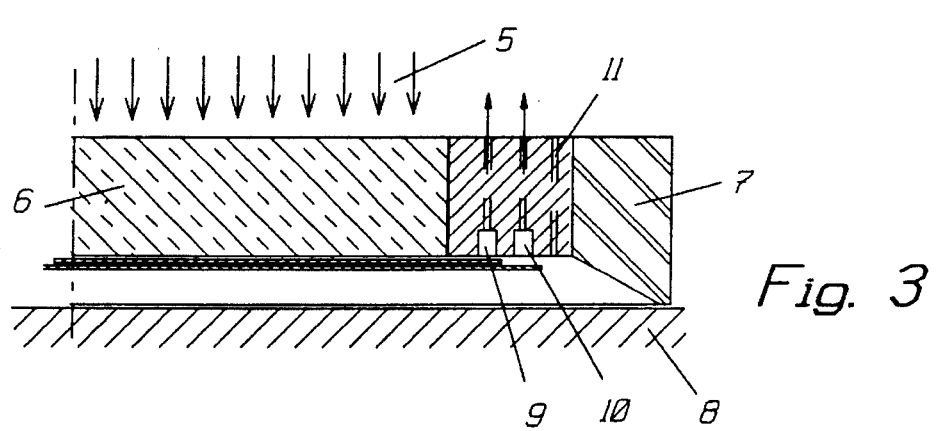
Figure 4:
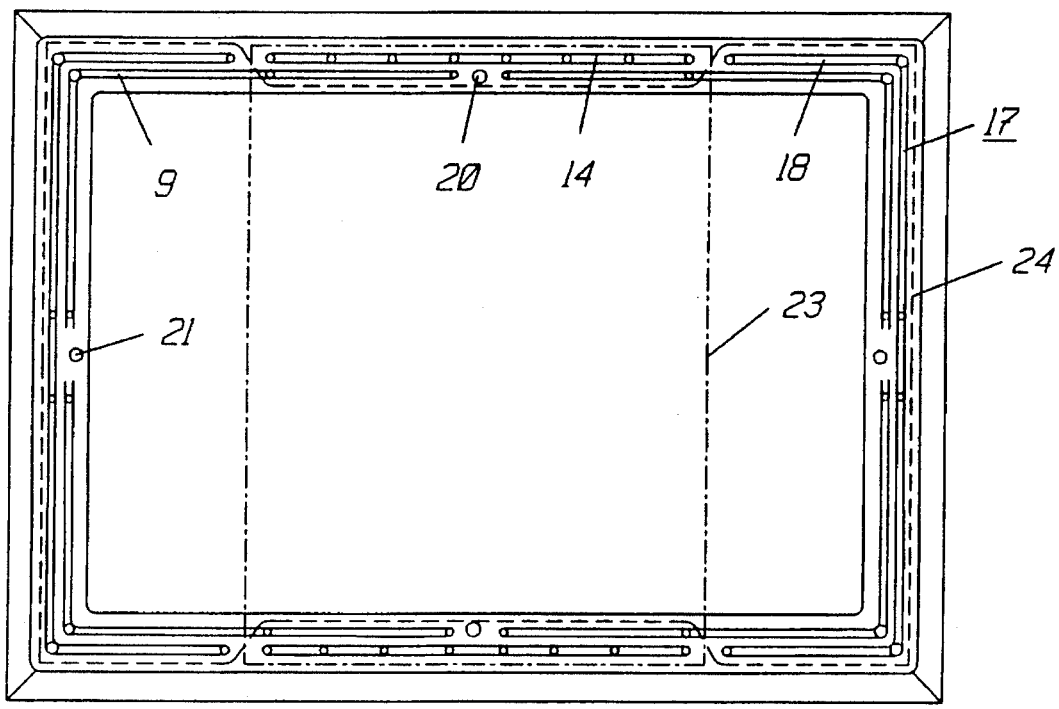
Figure 5:
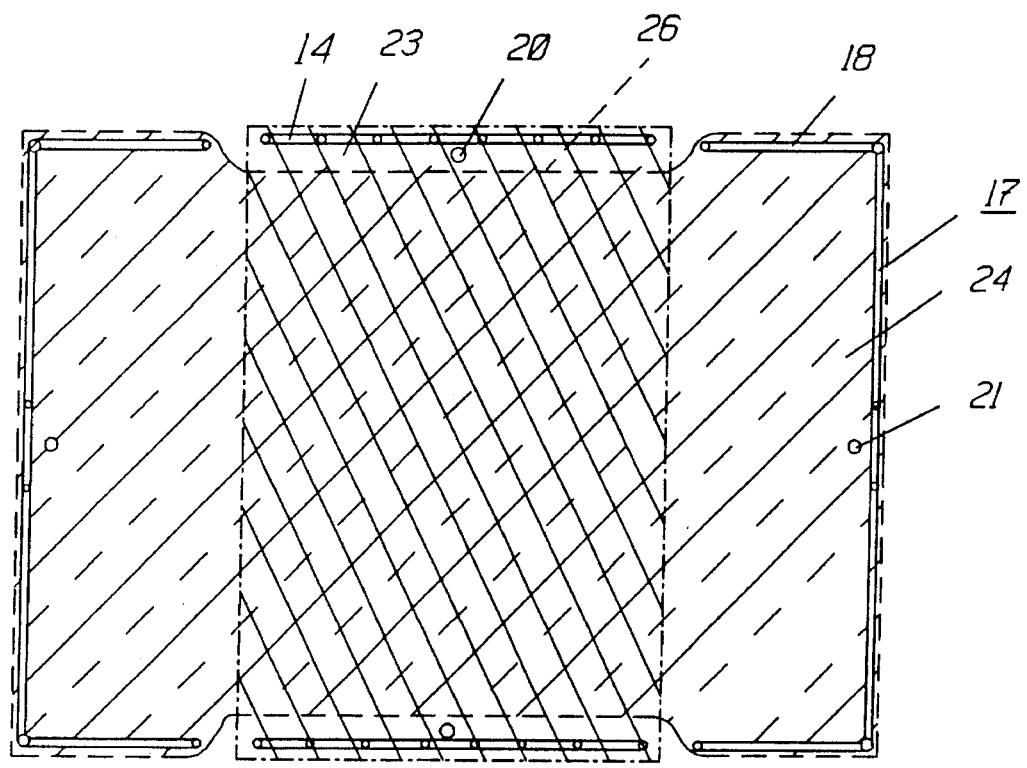
Figure 6:
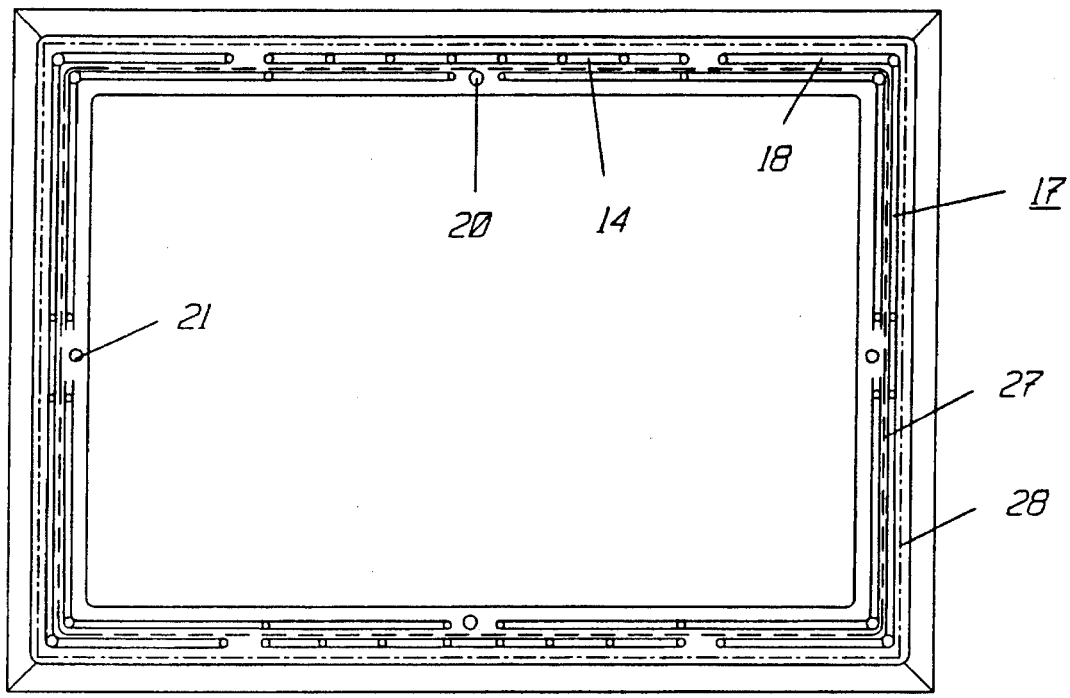
Figure 7:
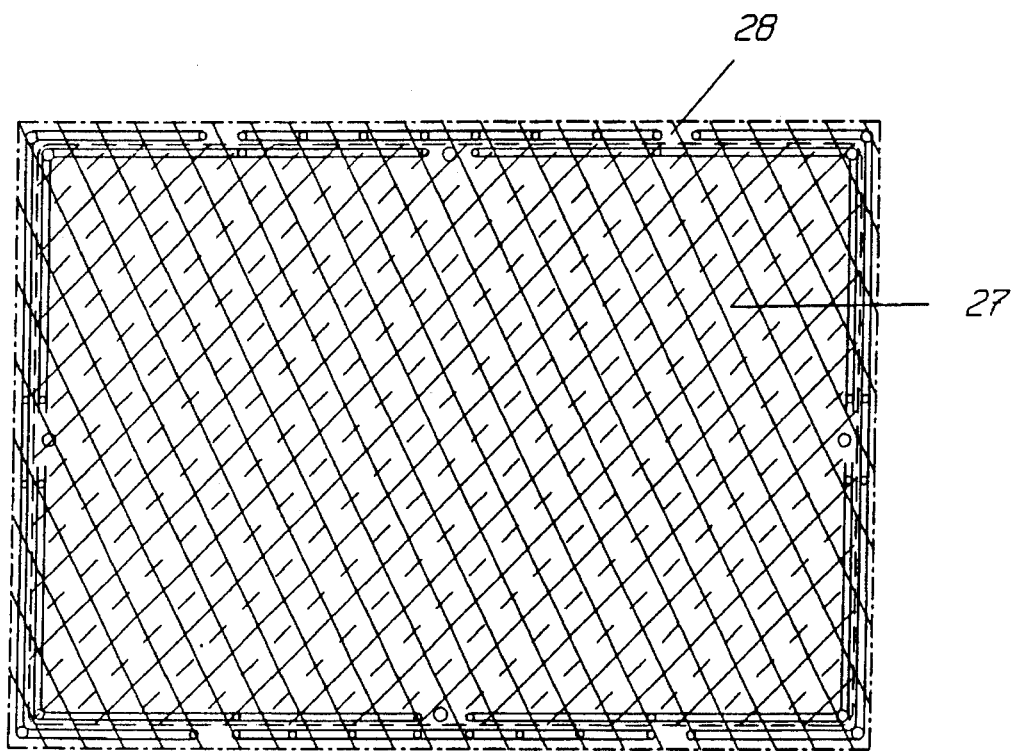

In the drawings FIG. 1 diagrammatically shows a copying frame according to the invention in a perspective view and in a vertical cross section. FIG. 2 shows the copying frame from underneath and with diagrammatically indicated connections for the suction channels. FIG. 3 shows a cross section view in an enlarged scale following line III—III of FIG. 2. FIG. 4 shows the copying frame from underneath while copying a "small" size original film together with a masking film, and FIG. 5 shows the location of the films on the copying frame more in detail. FIG. 6 shows the copying machine, like in FIG. 4, while performing a copying of a "large" size original film, and FIG. 7 shows, like in FIG. 5, the location of the films on the copying frame.

The copying frame shown diagrammatically and in a cross section view in FIG. 1 is a part of known types or copying machines which can be of various types. The frame is of the type in which the original films and the masking films are suction connected to the bottom surface of the copying frame. Of course the invention also can be utilized for copying frames in which the films are placed and suction connected to the upper surface of the copying frame.

The copying frame comprises a frame plate 1 which is the supporting part of the copying frame and which, at the bottom surface thereof, has a frame rim 2. Both the frame plate 1 and the frame rim 2 has a recess 3 and 4 respectively for letting exposure light 5 through said objects. In the recess 4 of the frame rim 2 a glass plate 6 is mounted. The bottom side of the glass plate 6 is formed as an even surface in common with the bottom surface of the frame rim 2. A sealing rib 7 extends round the frame rim 2 and a slight distance down under the frame rim 2 and under the glass plate 6 for making it possible to sealingly suction connect the entire copying frame to a light sensitive material like a printing plate placed on a copying table 8.

The frame rim 2 is formed with at least three different suction systems which open at the bottom surface of the frame rim 2, namely an inner suction channel 9 for suction connecting a first film, in particular a masking film, an outer suction channel 10 for suction connecting a second film, in particular an original film, and a third still further out provided suction connection 11 for creating the contact vacuum by means of which the copying frame is sucked to the copying table 8 and the light sensitive material. Each of the suction channels 9, 10 and 11 is connected to a separate source of sub pressure (vacuum) or to one and the same source of sub pressure over passageways going through the frame rim 2, and each including a connection and disconnection valve.

In conventional copying frames the suction channels corresponding to channels 9 and 10 have a mainly linerary, uninterrupted suction action. The inner channel 9 is usually used for suction connecting a masking film 12, and the outer suction channel 10 is used for suction connecting an original film 13. As mentioned above this makes it possible to handle only one single "large" size film type matching the special copying frame and the register pins thereof.

For making it possible the handle two different sizes of films, for instance A3 films and A4 films, the suction channel systems according to the invention are designed as more clearly shown in FIGS. 2–7. The inner suction channel 9 is substantially as large as the equivalent suction channel of conventional copying frames. The outer suction channel 10, on the contrary, which is used for suction connecting the original film 13, is split into two suction channel systems, namely a first system for handling of "small" size original films, e.g. A4 films, and a second system for handling of "large" size original films, e.g. A3 films. As mentioned above the two suction channel systems may be connected to one and the same source of sub pressure.

The first mentioned system comprises two suction channel grooves 14 which are provided centred, one on each long side of the frame rim 2, and which can be connected to a valve 15 for connection and disconnection of the suction action. Each channel groove 14 has a length which is slingtly less than the width of the actual "small" size original film, and said grooves 14 are spaced from each other by a distance which is slightly less than the length of the "small" size original film. As conventional said channels are formed with several suction distribution bores 16.

The second suction channel system is formed by substantially C-shaped suction channels 17 having the flanges thereof facing each other ([]), which channels may also be connected to a connection and disconnection valve 19. The length and the width of the flanges and the web portions of the mutually cooperating C-channels 17 are slightly less than the length and the width of the actual "large" size original film.

For mounting of the masking films 12 and the original films 13 respectively the frame rim 2 is formed with register pins 20 for small size original films and register pins 21 for large size original films. Before being mounted said films are formed with bores exactly coinciding with the register pins 20 and 21. As mentioned above the suction system for the masking films is formed as one substantially continuously extending suction channel 9 which is connected to a cource of sub pressure 22.

FIGS. 4 ,and 5 show the copying frame used for copying of a small size original film 23, marked with phantom lines. It is possible, but not necessary, to use, in common therewith, a masking film 24 of special type or of standard type for screening off light from parts of the a printing plate 25 (see FIG. 1) or a similar object placed on the copying table 8, which parts are not to be exposed. The small size original film 23 is mounted with its register bores on the register pins 20 and is sucked to the copying frame by means of vacuum from the suction grooves 14. In practice it has shown, slithgly surprisingly, that it is quite possible to keep the small size original film 23 steadily sucked to the copying frame only by means of the two spaced parallel suction grooves 14.

The masking film 24, which is marked with dotted lines, is of substantially the same size as a "large" size original film, but along each longitudinal side thereof there is a slit 26 which exposes the suction grooves 14 of the small film and the register pins 20. The masking film is being mounted by means of the register pins 21 for the "large" size film, and it is suction is being mounted by means of the suction grooves 17 for the large film. Thanks to the slits 26 the masking film 24 can, as conventional, be mounted closest to the copying frame, and thereafter a "small" size original film 23 can be mounted on the exposed register pins 20 and can be suction connected by means of the suction grooves 14.

Alternatively it is possible to utilize the method according to the invention for copying a "small" size original film in an available copying machine having one single source of sub pressure for an original film. In this case there is preferably used a clear, transparent foil having slits 26 sized corresponding to the little original film, and this clear foil is placed in the film magazine underneath a "small" size original film. When the coyping frame is thereafter lowered to the film magazine it catches both the "small" size original film and the "large" size foil, whereby the original film and the foil are suction connected actuated from one and the same source of sub pressure. By this method it is possible to easily handle alternating large and small original films with cover foils, whereby said foils can be placed in any optional order in the film magazine.

The copying frame according to the invention can, without any modification thereof, be used also for copying of "large" films, and this is illustrated in FIGS. 6 and 7. Also in said figures the masking film 27 is marked with dotted lines and the original film 28 is marked with phantom lines. It is obvious that the masking film 27 and the original film 28 can be secured either by means of the register pins 20 or by means of the register pins 21, or both. The masking film 27 is, as conventional, suction connected by means of the C-shaped suction channels 17, 18, and it is thereby also possible to make use of the parallel channels 14 for the small original film for suction connecting a large original film.

What is claimed is:

1. Method of copying of negative or positive films onto a light sensitive material which is covered with a light sensitive layer using a copying frame, said copying frame comprising a frame plate having a frame rim of a non-transparent material and a glass plate inserted in a recess of said frame rim, against which glass plate one or more films are adapted to be suction connected under the actuation from suction channels arranged in the frame rim and are adapted to be copied down onto the light sensitive material by means of an exposure light passing through said glass, and in which the copying frame comprises two sets of suction grooves for handling of original films both of a "small" size format and of a "large" size format, said suction grooves comprising:

a) two cooperating, separate, parallel grooves for the "small" size film format, each being located along the long side of the copying frame and extending a distance corresponding to the width of the "small" film format, and which grooves are spaced by a distance which corresponds to the length of said "small" size film format; and b) two separate and cooperating, mainly C-shaped grooves having the openings thereof facing each other, which grooves provide the main suction channel for the "large" size original film format, and each C-shaped groove of which extends over an entire short side and a slight distance along each long side of the copying frame, but not as far as to the grooves for the "small" size film format, said method comprising:

placing small and large original films in a film magazine, placing a large masking film or cover foil having slits corresponding to the cooperating parallel grooves for a "small" original film over or under each "small" original film, lowering the copying frame to the film magazine, whereby, in one stage, a "large" original film is suction connected by means of both the parallel suction grooves for a "small" original film and the C-shaped grooves for a "large" original film, whereas, in another stage, a "small" original film is suction connected only by the parallel suction grooves, and, concurrently therewith, suction-connecting a masking film or a cover foil by the C-shaped suction grooves, so that the copying frame in the last mentioned stage carries both a "small" original film and a cover foil.

2. Method according to claim 1, characterized in that a masking film is placed over a "small" size original film, and a cover foil is placed underneath said "small" size original film, whereby the copying frame suction connects the masking film by means of inner suction grooves and, at the same time, suction connects the "small" size original film by means of the parallel outer suction grooves and the cover foil by means of the C-shaped outer suction grooves.

3. Copying frame for copying of negative and positive original films onto a light sensitive material which is covered with a light sensitive layer, comprising a frame plate having a frame rim of a non-transparent material and a glass plate inserted in a recess of said frame rim, against which glass plate one or more films are adapted to be suction connected under the actuation of suction channels arranged in the frame rim and are adapted to be copied down onto a light sensitive material by means of an exposure light passing through said frame rim glass plate said copying frame including two sets of suction grooves for handling of original films both of a "small" size format and of a "large" size format, said suction grooves comprising:

a) two cooperating, separate parallel grooves for the "small" size film format, each being provided along a long side of the copying frame and extending a distance corresponding to the width of the "small" film format, and which grooves are spaced by a distance which corresponds to the length of said small size film format; and b) two separate and cooperating, mainly C-shaped grooves having the openings thereof facing each other, which grooves provide the main suction channel for the "large" size original film format, and each C-shaped groove of which extends over an entire short side and a slight distance along each long side of the copying frame, but not as far as to the grooves for the "small" size film format.

4. Copying frame according to claim 3, characterized in that the suction channels for the "small" size original film and for the "large" size original film respectively are formed with separate means for connection and disconnection respectively of the suction function.

5. Copying frame according to claim 3, characterized in that it is formed with two set of register pins, one set of which is intended for attaching a "small" size original film in a predetermined position against the copying frame and the second set of which is intended for attaching the "small" size original film together with a masking film to the copying frame or for attaching a "large" size original film and masking film to the copying frame.

6. Copying frame according to claim 5, characterized in that the register pin for the "small" size original film (23), and the suction channels for the "small" size original film are arranged in such positions on the copying frame that the "small" size original film is attached and is suction connected centrally on the copying frame.

7. Copying frame according to claim 5, characterized in that the masking film associated with the "small" size original film has substantially the same size as the "large" size film format, and in that said masking film is formed with slits along the two long sides thereof, which slits expose the suction channels for the "small" size film.

8. Copying frame according to claim 3, characterized in that the copying frame has an inner suction channel adapted for suction connecting a masking film and an associated "large" size original film.

9. Copying frame according to claim 8, characterized in that each of the two suction grooves and the inner suction channel for the "large" size masking film has it own separate means for connection and disconnection respectively of the suction function of the channel system.

10. Method according to claim 1 wherein said light sensitive material comprises a printing plate or a light sensitive collection film.

11. Method according to claim 10 wherein the parallel grooves for the "small" size film format are located centrally of said long sides of the copying frame.

12. Copying frame according to claim 3 wherein the grooves for the "small" size film format are provided centrally of the long sides of the copying frame.

* * * * *